United States Patent
Chun et al.

(10) Patent No.: US 7,761,768 B2
(45) Date of Patent: Jul. 20, 2010

(54) TECHNIQUES FOR RECONFIGURABLE DECODER FOR A WIRELESS SYSTEM

(75) Inventors: Anthony L. Chun, Los Altos, CA (US); Bo Xia, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 445 days.

(21) Appl. No.: 11/166,591

(22) Filed: Jun. 24, 2005

(65) Prior Publication Data

US 2006/0294446 A1 Dec. 28, 2006

(51) Int. Cl.
*H03M 13/00* (2006.01)

(52) U.S. Cl. .................. 714/752; 714/758; 714/792; 710/105

(58) Field of Classification Search ........... 714/792, 714/752, 758; 710/10, 11, 104, 105
See application file for complete search history.

(56) References Cited

U.S. PATENT DOCUMENTS

| | | | |
|---|---|---|---|
| 5,151,904 A | | 9/1992 | Reiner et al. |
| 6,539,367 B1 * | | 3/2003 | Blanksby et al. .............. 706/14 |
| 7,568,059 B2 * | | 7/2009 | Solomon et al. ............ 710/105 |
| 2002/0119803 A1 * | | 8/2002 | Bitterlich et al. ............ 455/552 |
| 2003/0104788 A1 * | | 6/2003 | Kim .......................... 455/67.3 |
| 2004/0255230 A1 * | | 12/2004 | Chen et al. ................... 714/796 |
| 2005/0262421 A1 * | | 11/2005 | Tran et al. ................... 714/758 |
| 2006/0010272 A1 * | | 1/2006 | Solomon et al. ............. 710/105 |
| 2006/0026486 A1 * | | 2/2006 | Richardson et al. ......... 714/758 |
| 2006/0048037 A1 * | | 3/2006 | Solomon et al. ............ 714/792 |
| 2007/0011568 A1 * | | 1/2007 | Hocevar ..................... 714/758 |
| 2007/0011654 A1 * | | 1/2007 | Opperman .................. 717/122 |
| 2007/0168832 A1 * | | 7/2007 | Richardson et al. ......... 714/758 |

FOREIGN PATENT DOCUMENTS

| | | |
|---|---|---|
| EP | 1158682 A2 | 11/2001 |
| WO | 02054601 A1 | 7/2002 |
| WO | 2005002061 A1 | 6/2005 |
| WO | 2007002668 A1 | 1/2007 |

OTHER PUBLICATIONS

Babvey, S. et al., "A Parallel Implementation of the Message-Passing Decoder of LDPC Codes Using a Reconfigurable Optical Model", Software Engineering, Artificial Intelligence, Networking and Parallel/Distributed Computing, (May 23, 2005), pp. 288-293.

Theocharides, T. et al., "Implementing LDPC Decoding on Network-on-Chip", VLSI Design, (Jan. 3, 2005), pp. 134-137.

Fanucci, L. et al., "A throughout/complexity analysis for the VLSI implementation of LDPC decoder", Signal Processing and Information Technology, (Dec. 18, 2004), pp. 409-412.

* cited by examiner

*Primary Examiner*—Sam Rizk
(74) *Attorney, Agent, or Firm*—Scott M. Lane

(57) ABSTRACT

A system, apparatus, method, and article including a decoder having multiple connections defined between multiple check nodes and multiple symbol nodes. The connections between the multiple check nodes and the multiple symbol nodes are reconfigurable to enable the decoder to decode multiple codes. Other embodiments are described and claimed. The system further includes an antenna.

8 Claims, 6 Drawing Sheets

500

510

TECHNIQUES FOR RECONFIGURABLE DECODER FOR A WIRELESS SYSTEM

BACKGROUND

Various communication systems exist today to allow electronic devices such as computers to communicate and exchange data and other types of information such as voice and multimedia communications (e.g., video, sound, data) over local and distributed networks. Various wireless communication systems, such as Wireless Local Area Networks (WLAN) also allow mobile computers to communicate with each other and other computers connected to Wide Area Networks (WAN) such as Internet.

Telecommunications systems apply low-density parity-check (LDPC) codes to provide error correction capability. These LDPC codes are being applied to a variety of telecommunications standards, including, for example, Digital Video Broadcast Via Satellite (DVB-S2), the Institute of Electrical and Electronics Engineers (IEEE) 802.11n Wireless LAN proposal, the IEEE 802.16e Wireless Metropolitan Area Network (MAN) proposal, among others. In many telecommunications error correction applications, it may be desirable to have a LDPC decoder that is reconfigurable to decode a variety of codes in a single receiver and to have a radio product available as soon as a standard is finalized.

Error correction codes are an essential component of many wireless standards. Three types of codes that are currently being used are convolutional codes (usually decoded using the Viterbi algorithm), turbo codes (decoded using the BCJR algorithm, a forward-backward a posteriori probability (APP) decoding algorithm published by Bahl, Cocke, Jelinek, and Raviv), and most recently LPDC codes (decoded using the Message Passing Algorithm (MPA)). A computational element common to all three of these algorithms is a variation of the Add-Compare-Select (ACS) operation. In many telecommunications error correction applications, it may be desirable to have a version of the ACS algorithm that is reconfigurable to support a variety of decoders.

DETAILED DESCRIPTION

Figure 1:
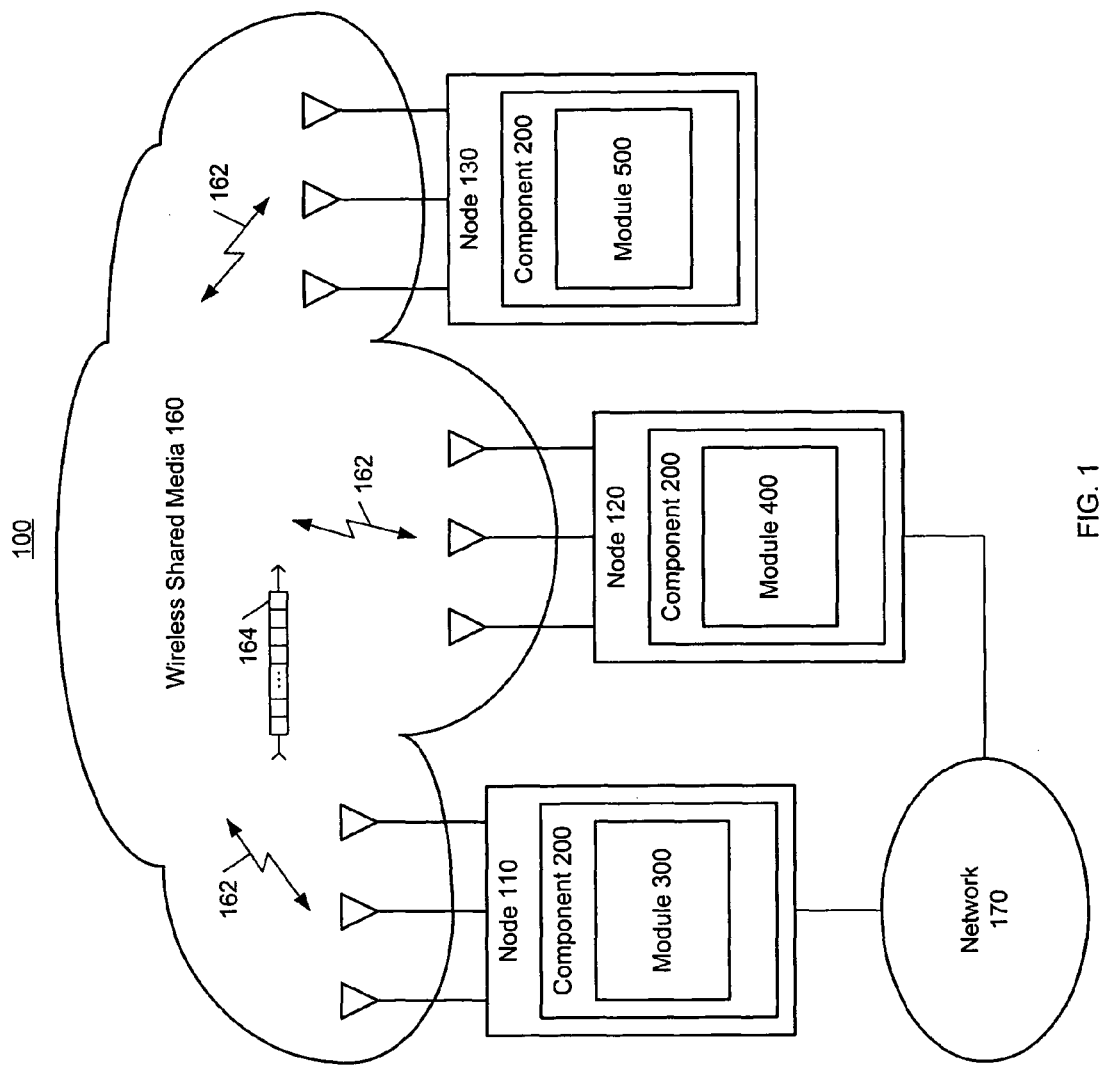
FIG. 1 illustrates one embodiment of a system 100.

FIG. 1 illustrates one embodiment of a system. FIG. 1 may illustrate a block diagram of a system 100, for example. System 100 may be a distributed system. System 100 may comprise, for example, a communication system having multiple nodes. A node may comprise any physical or logical entity having a unique address in system 100. Examples of a node may include, but are not necessarily limited to, a computer, server, workstation, laptop, ultra-laptop, handheld computer, telephone, cellular telephone, personal digital assistant (PDA), router, switch, bridge, hub, gateway, wireless access point, and so forth. The unique address may comprise, for example, a network address such as an Internet Protocol (IP) address, a device address such as a MAC address, and so forth. The embodiments are not limited in this context.

The nodes of system 100 may be arranged to communicate different types of information, such as media information and control information. Media information may refer to any data representing content meant for a user, such as voice information, video information, audio information, text information, numerical information, alphanumeric symbols, graphics, images, and combinations thereof, for example. Control information may refer to any data representing commands, instructions or control words meant for an automated system. For example, control information may be used to route media information through a system, or instruct a node to process the media information in a predetermined manner.

The nodes of system 100 may communicate media and control information in accordance with one or more protocols. A protocol may comprise a set of predefined rules or instructions to control how the nodes communicate information between each other. The protocol may be defined by one or more protocol standards as promulgated by a standards organization, such as the Internet Engineering Task Force (IETF), International Telecommunications Union (ITU), the IEEE, and so forth. For example, system 100 may operate in accordance with various WLAN protocols, such as the IEEE 802.11 series of protocols, including the IEEE 802.11a, 802.11b, 802.11e, 802.11g, 802.11n, and so forth. In another example, system 100 may operate in accordance with various WMAN mobile broadband wireless access (MBWA) protocols, such as a protocol from the IEEE 802.16 or 802.20 series of protocols.

Referring again to FIG. 1, system 100 may comprise a wireless communication system. In one embodiment, system 100 may comprise a WLAN or WMAN system operating in accordance with the IEEE 802.11, 802.16 or 802.20 series of standard protocols. In one embodiment, for example, system 100 may comprise a WLAN system operating with a number of high throughput (HT) wireless devices arranged to operate in accordance with one or more of the IEEE-802.11n proposed standards. The embodiments are not limited in this context.

In one embodiment, system 100 may include one or more wireless communication devices, such as nodes 110, 120, 130. Nodes 110, 120, 130 all may be arranged to communicate information signals using one or more wireless transmitters/receivers ("transceivers") or radios, which may involve the use of radio frequency communication via IEEE 802.11 Frequency Hopping Spread Spectrum (FHSS) or Direct Sequence Spread Spectrum (DSSS) schemes, for example. Nodes 110, 120, 130 may communicate using the radios over wireless shared media 160 via multiple inks or channels established therein. For example, the radios may be arranged to operate using the 2.45 Gigahertz (GHz) Industrial, Scientific, and Medical (ISM) band of wireless shared media 160. Other operating bands may be used as well. Information signals may include any type of signal encoded with information, such as media and/or control information. Although FIG. 1 is shown with a limited number of nodes in a certain topology, it may be appreciated that system 100 may include more or less nodes in any type of topology as desired for a given implementation. The embodiments are not limited in this context.

In one embodiment, system 100 may include nodes 110, 120. Nodes 110, 120 may comprise fixed devices having wireless capabilities. A fixed device may comprise a generalized equipment set providing connectivity, management, and control of another device, such as mobile devices. Examples for nodes 110, 120 may include a wireless access point (AP), base station or node B, router, switch, hub, gateway, and so forth. In one embodiment, for example, nodes 110, 120 may comprise access points for a WLAN system. Although some embodiments may be described with nodes 110, 120 implemented as an AP by way of example, it may be appreciated that other embodiments may be implemented using other wireless devices as well.

In one embodiment, AP 110, 120 also may provide access to a network 170 via wired communications media. Network 170 may comprise, for example, a packet network such as the Internet, a corporate or enterprise network, a voice network such as the Public Switched Telephone Network (PSTN), among other WANs, for example. The embodiments are not limited in this context.

In one embodiment, system 100 may include node 130. Node 130 may comprise, for example, a mobile device or a fixed device having wireless capabilities. A mobile device may comprise a generalized equipment set providing connectivity to other wireless devices, such as other mobile devices or fixed devices. Examples for node 130 may include a computer, server, workstation, notebook computer, handheld computer, telephone, cellular telephone, personal digital assistant (PDA), combination cellular telephone and PDA, and so forth. In one embodiment, for example, node 130 may comprise a mobile device, such as a mobile station (STA) for a WLAN. In a WLAN implementation, the combination of an AP and associated stations may be referred to as a Basic Service Set (BSS). Although some embodiments may be described with STA 130 implemented as a mobile station for a WLAN by way of example, it may be appreciated that other embodiments may be implemented using other wireless devices as well. For example, node 130 also may be implemented as a fixed device such as a computer, a mobile subscriber station (MSS) for a WMAN, and so forth. The embodiments are not limited in this context.

Nodes 110, 120, 130 may have one or more wireless transceivers and wireless antennas. In one embodiment, for example, nodes 110, 120, 130 may each have multiple transceivers and multiple antennas. The use of multiple antennas may be used to provide a spatial division multiple access (SDMA) system or a multiple-input multiple-output (MIMO) system in accordance with one or more of the IEEE 802.11n proposed standards, for example. Multiple transmitting antennas may be used to increase data rates in a channel or to increase range and reliability of data transmitted in a channel without an increase in data rates. Data rates also may be increased by using multiple antennas to transmit data in multiple channels at the same time. Multiple receiving antennas may be used to efficiently recover transmitted data. The embodiments are not limited in this context.

In general operation, the nodes of system 100 may operate in multiple operating modes. For example, nodes 110, 120, 130 may operate in at least one of the following operating modes: a single-input-single-output (SISO) mode, a multiple-input-single-output (MISO) mode, a single-input-multiple-output (SIMO) mode, and/or in a MIMO mode. In a SISO operating mode, a single transmitter and a single receiver may be used to communicate information signals over a wireless shared medium 160. In a MISO operating mode, two or more transmitters may transmit information signals over wireless shared media 160, and information signals may be received from wireless shared media 160 by a single receiver of a MIMO system. In a SIMO operating mode, one transmitter and two or more receivers may be used to communicate information signals over wireless shared media. In a MIMO operating mode, two or more transmitters and two or more receivers may be used to communicate information signals over wireless shared media 160. A channel 162, link, or connection may be formed using one or more frequency bands of wireless shared medium 160 for transmitting and receiving packets 164. The embodiments are not limited in this context.

In system 100, STA 130 may communicate with various AP, such as AP 110, 120. To communicate with AP 110 or AP 120, STA 130 may first need to associate with a given AP. Once STA 130 is associated with an AP, STA 130 may need to select a data rate for packets with media and control information over wireless shared media 160.

STA 130 may select a data rate once per association, or may periodically select data rates to adapt to transmitting conditions of wireless shared media 160. Adapting data rates to transmitting conditions may sometimes be referred to as rate adaptation operations.

A WLAN such as system 100 may operate at a number of different data rates or data throughputs. For example, original 802.11 systems using DSSS radios offered only two physical data rates of 1 Megabits per second (Mbps) or 2 Mbps. Current WLAN systems operating in accordance with a number of orthogonal frequency division multiplexing (OFDM) techniques, however, may support a wide range of data rates of up to 54 Mbps or more in the 2.4 GHz region. Other potentially higher data rates and transmit modes may be available as well. Examples of such WLAN systems may include 802.11g and 802.11n systems.

Accordingly, in one embodiment, system 100 may comprise component 200 in associated nodes 110, 120, 130 to implement techniques to provide communications devices that support multiple standards in order to improve overall performance in nodes 110, 120, 130, and to increase overall system 100 performance. Component 200 may comprise a module 300, a module 400, or a module 500 depending on the particular embodiment thereof. In one embodiment, module 300 may comprise module 400 and module 500 as shown with respect to node 110, for example. In one embodiment, module 400 may comprise a reconfigurable LDPC decoder to decode a variety of codes in a single receiver. In one embodiment, this provides the capability of having a transceiver available for production as soon as a particular standard is finalized. The reconfigurable LDPC decoder may be implemented either as a Digital Signal Processor (DSP) or an Application Specific Integrated Circuit (ASIC). Embodiments of module 300 comprising a reconfigurable LDPC decoder implemented as a DSP may provide a flexible solution although the speed that it can operate at may be limited by power constraints, for example. Embodiments of module 400 comprising a reconfigurable LDPC decoder implemented as an ASIC may operate at higher speeds although it may not provide the same flexibility as a DSP implementation because it is "hard-wired" and, accordingly, may be difficult to reconfigure once it has been built. Embodiments of module 400 comprising a reconfigurable LDPC decoder may be programmed for decoding multiple codes by downloading new programming into the decoder's address generator modules. Further, a reconfigurable LDPC decoder may be programmed for new protocols, thus enabling it to be more widely used across telecommunications products with less time-to-market. Moreover, embodiments of a reconfigurable LDPC decoder reduces the complex routing between check and symbol nodes, thus simplifying its implementation.

In one embodiment, component 200 may comprise module 500. In one embodiment, module 500 may comprise a reconfigurable ACS decoder to support multiple types of decoders. For example, in one embodiment, a reconfigurable ACS decoder may support a Viterbi algorithm decoder, a BCJR decoder, and an LDPC decoder. Embodiments of module 500 may comprise a reconfigurable ACS decoder that may be configured to decode Viterbi convolutional codes, turbo codes, and LDPC codes, for example. Further, a reconfigurable ACS decoder may provide the capability of decoding these three types of codes and may require less area and power than implementations comprising all three separate decoders. Moreover, embodiments of receivers that incorporate a reconfigurable ACS decoder may be reprogrammed for new protocols, thus enabling it to be more widely used across telecommunications products with less time-to-market.

In various embodiments, system 100 may be illustrated and described as comprising several separate functional elements, such as modules and/or blocks. Although certain modules and/or blocks may be described by way of example, it can be appreciated that a greater or lesser number of modules and/or blocks may be used and still fall within the scope of the embodiments. Further, although various embodiments may be described in terms of modules and/or blocks to facilitate description, such modules and/or blocks may be implemented by one or more hardware components (e.g., processors, DSPs, PLDs, ASICs, circuits, registers), software components (e.g., programs, subroutines, logic) and/or combination thereof.

In various embodiments, system 100 may comprise multiple modules connected by one or more communications media. Communications media generally may comprise any medium capable of carrying information signals. For example, communications media may comprise wired communications media, wireless communications media, or a combination of both, as desired for a given implementation. Examples of wired communications media may include a wire, cable, printed circuit board (PCB), backplane, semiconductor material, twisted-pair wire, co-axial cable, fiber optics, and so forth. An example of a wireless communications media may include portions of a wireless spectrum, such as the radio-frequency (RF) spectrum. The embodiments are not limited in this context.

The modules may comprise, or be implemented as, one or more systems, sub-systems, devices, components, circuits, logic, programs, or any combination thereof, as desired for a given set of design or performance constraints. For example, the modules may comprise electronic elements fabricated on a substrate. In various implementations, the electronic elements may be fabricated using silicon-based IC processes such as complementary metal oxide semiconductor (CMOS), bipolar, and bipolar CMOS (BiCMOS) processes, for example. The embodiments are not limited in this context.

Figure 2:
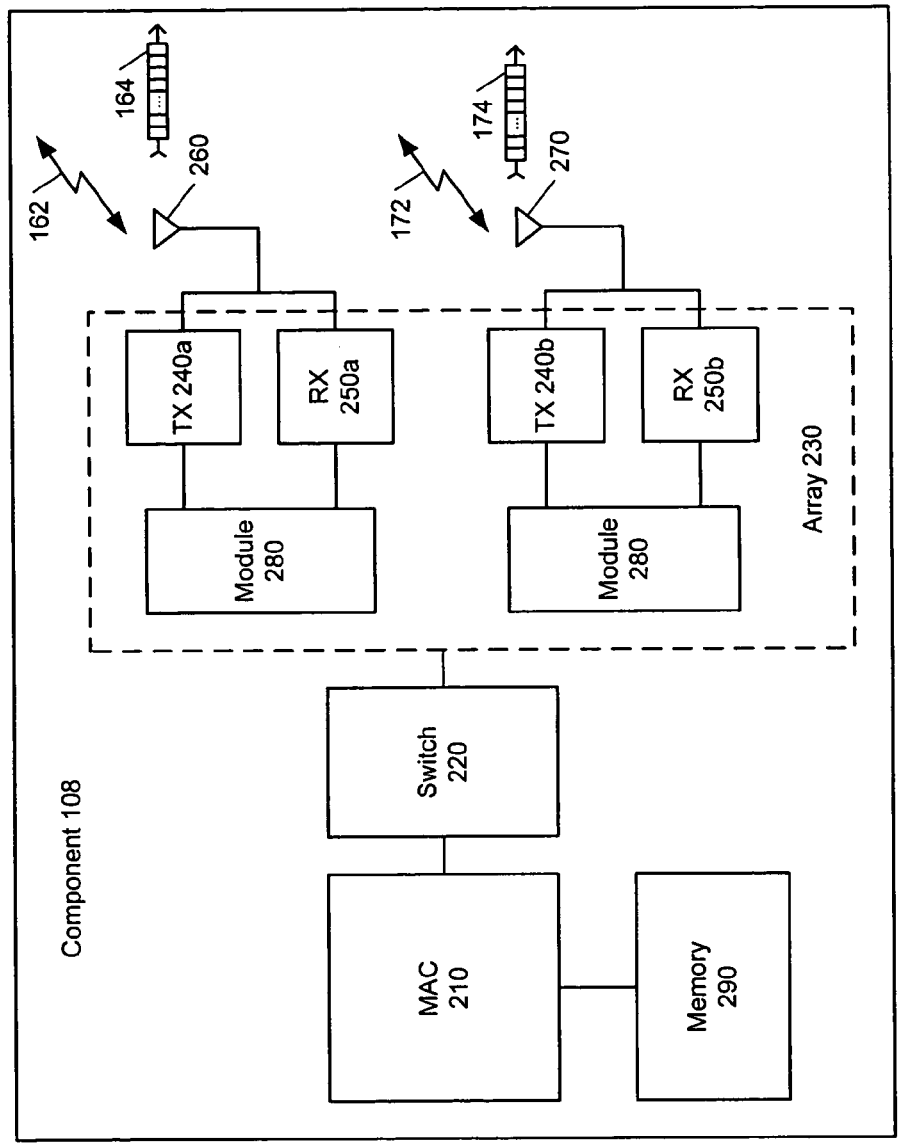
FIG. 2 illustrates one embodiment of a component 200.

FIG. 2 illustrates one embodiment of a component. FIG. 2 may illustrate a block diagram for component 200 of system 100, for example. Component 200 may be implemented as part of nodes 110, 120 or 130 as described with reference to FIG. 1. As shown in FIG. 2, component 200 may comprise multiple elements, such as processor 210, switch (SW) 220, transceiver array 230, and memory 290. Some elements may be implemented using, for example, one or more circuits, components, registers, processors, software subroutines, or any combination thereof. Although FIG. 2 shows a limited number of elements, it can be appreciated that more or less elements may be used in component 200 as desired for a given implementation. The embodiments are not limited in this context.

In one embodiment, component 200 may include transceiver array 230. Transceiver array 230 may comprise multiple transmitter 240a, b and receiver 250a, b pairs. In one embodiment, each transmitter 240a, b and receiver 250a, b pair may comprise module 280, which may comprise various embodiments of modules 300, 400, and 500, for example, based on the specific embodiments thereof. Transceiver array 230 may be implemented as, for example, a MIMO system. MIMO system 230 may include two transmitters 240a and 240b, and two receivers 250a and 250b. Although MIMO system 230 is shown with a limited number of transmitters and receivers, it may be appreciated that MIMO system 230 may include any desired number of transmitters and receivers. The embodiments are not limited in this context.

In one embodiment, transmitters 240a-b and receivers 250a-b of MIMO system 230 may be implemented as OFDM transmitters and receivers. Transmitters 240a-b and receivers 250a-b may communicate packets 164, 174, respectively, with other wireless devices over channels 162, 172, respectively. For example, when implemented as part of AP 110 or AP 120, transmitters 240a-b and receivers 250a-b may communicate packets 164, 174 with STA 130. When implemented as part of STA 130, transmitters 240a-b and receivers 250a-b may communicate packets 164, 174 with AP 110 or AP 120. The packets may be modulated in accordance with a number of modulation schemes, to include Binary Phase Shift Keying (BPSK), Quadrature Phase-Shift Keying (QPSK), Quadrature Amplitude Modulation (QAM), 16-QAM, 64-QAM, and so forth. The embodiments are not limited in this context.

In one embodiment, transmitter 240a and receiver 250a may be operably coupled to an antenna 260, and transmitter 240b and receiver 250b may be operably coupled to antenna 270. Examples for antenna 260 and/or antenna 270 may include an internal antenna, an omni-directional antenna, a monopole antenna, a dipole antenna, an end fed antenna, a circularly polarized antenna, a micro-strip antenna, a diversity antenna, a dual antenna, an antenna array, a helical antenna, and so forth. In one embodiment, system 100 may be implemented as a MIMO based WLAN comprising multiple antennas to increase throughput and may trade off increased range for increased throughput. MIMO-based technologies may be applied to other wireless technologies as well. Although in one embodiment system 100 may be implemented as a WLAN in accordance with 802.11a/b/g/n protocols for wireless access in an enterprise, other embodiments in use in the enterprise may include reconfigurable radio technologies and/or multiple radios (e.g., multiple transceivers, transmitters, and/or receivers), for example. The embodiments are not limited in this context.

In one embodiment, component 200 may include a processor 210. Processor 210 may be implemented as a general purpose processor. For example, processor 210 may comprise a general purpose processor made by Intel® Corporation, Santa Clara, Calif. Processor 210 also may comprise a dedicated processor, such as a controller, microcontroller, embedded processor, a digital signal processor (DSP), a network processor, an input/output (I/O) processor, a media processor, and so forth. The embodiments are not limited in this context.

In one embodiment, component 200 may include a memory 290. Memory 290 may comprise any machine-readable or computer-readable media capable of storing data, including both volatile and non-volatile memory. For example, the memory may comprise read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, or any other type of media suitable for storing information. The embodiments are not limited in this context.

In one embodiment, nodes 110, 120, 130 of system 100 may operate in accordance with one or more of the IEEE 802.11 series of specifications. A wireless device operating in accordance with an IEEE 802.11 specification may require the implementation of at least two layers. One layer is the 802.11 MAC layer (i.e., OSI Data/Link Layer 2). In general, the MAC layer manages and maintains communications between 802.11 devices by coordinating access to a shared radio channel and utilizing protocols to enhance communications over wireless shared media 160. For example, the MAC layer may perform such operations as scanning for 802.11 devices, authenticating 802.11 devices, associating an AP with a STA, performing security techniques such as wireless encryption protocol (WEP), request to send (RTS) and clear to send (CTS) operations to access wireless shared media 160, power saving operations, fragmentation operations, and so forth. Another layer is the 802.11 PHY layer (i.e., OSI Physical Layer 1). The PHY layer may perform the operations of carrier sensing, transmission, and receiving of 802.11 frames. For example, the PHY layer may integrate operations such as modulation, demodulation, encoding, decoding, analog-to-digital conversion, digital-to-analog conversion, filtering, and so forth. The PHY layer is typically implemented using dedicated hardware. The MAC layer, however, is typically implemented using a combination of dedicated hardware and dedicated software. In one embodiment, module 300 may provide cross-layer adaptation between any of the layers in the OSI protocol stack.

In one embodiment, processor 210 may be arranged to perform MAC layer operations. For example, processor 210 may be implemented as a media access control (MAC) processor. MAC 210 may be arranged to perform MAC layer processing operations. In addition, MAC 210 may be arranged to select a data rate to communicate media and control information between wireless devices over wireless shared media 160 in accordance with one or more WLAN protocols, such as one or more of the IEEE 802.11n proposed standards, for example. The embodiments, however, are not limited in this context.

When implemented in a node of system 100, component 200 may be arranged to communicate information in wireless shared media 160 between the various nodes, such as AP 110, AP 120, and STA 130. The information may be communicated in the form of packets 164, 174 over channels 162, 172 established, with each packet 164, 174 comprising media information and/or control information. The media and/or control information may be represented using, for example, multiple OFDM symbols. Packets 164, 174 may be part of a frame, which in this context may refer to any discrete set of information, including a unit, packet, cell, segment, fragment, and so forth. The frame may be of any size suitable for a given implementation. Typical WLAN protocols use frames of several hundred bytes, and an 802.11 frame may have a length of up to 1518 bytes or more, for example. In one embodiment, nodes of system 100 and component 200 may be arranged to communicate information over wireless shared media 160 between the various nodes, such as AP 110, AP 120, and STA 130. Although embodiments describe communication of information in the form of packets 164, 174 over wireless channels 162, 172, the embodiments are not limited in this context.

When implemented as part of STA 130, MAC 210 may be arranged to associate with an AP. For example, MAC 210 may passively scan for access points, such as AP 110, 120. AP 110, 120 may periodically broadcast a beacon. The beacon may contain information about the access point including a service set identifier (SSID), supported data rates, and so forth. MAC 210 may use this information and the received signal strength for each beacon to compare AP and decide upon which one to use. Alternatively, MAC 210 may perform active scanning by broadcasting a probe frame, and receiving probe responses from AP 110, 120. Once an AP has been selected, MAC 210 may perform authentication operations to prove the identity of the selected AP. Authentication operations may be accomplished using authentication request frames and authentication response frames. Once authenticated, STA 130 associates with the selected AP before sending packets. Association may assist in synchronizing STA 130 and the AP with certain information, such as supported data rates. Association operations may be accomplished using association request frames and association response frames containing elements such as SSID and supported data rates. Once association operations are completed, STA 130 and AP 110 can send packets to each other, although the embodiments are not limited in this regard.

In some embodiments, MAC 210 also may be arranged to select a data rate to communicate packets based on current channel 162, 172 conditions for wireless shared media 160. For example, assume STA 130 associates with a peer, such as an AP or other wireless device (e.g., AP 110). STA 130 may be arranged to perform receiver directed rate selection. Consequently, STA 130 may need to select a data rate to communicate packets 164, 174 between STA 130 and AP 110 prior to communicating the packets 164, 174.

Figure 3:
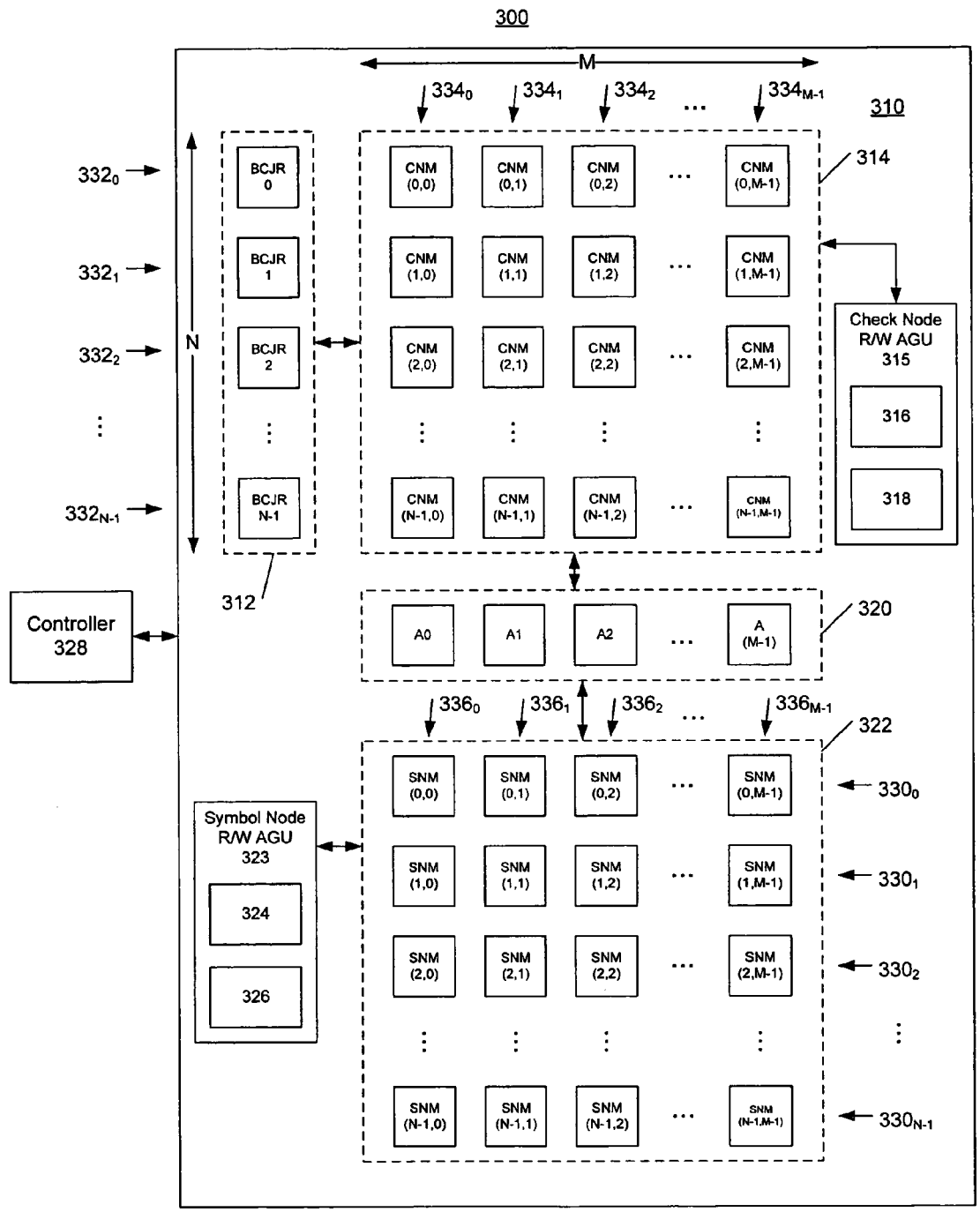
FIG. 3 illustrates one embodiment of a module 300.

FIG. 3 illustrates one embodiment of module 300. In one embodiment, module 300 may comprise, for example, a decoder. In one embodiment, module 300 may comprise a reconfigurable LDPC decoder 310 to decode a variety of codes in a single receiver, such as for example, receiver 250a or 250b in transceiver array 230 (FIG. 2). In one embodiment, reconfigurable LDPC decoder 310 may be used to implement a form of the Message Passing Algorithm (MPA) in which reconfigurable LDPC decoder 310 iterates between updating the check nodes and the symbol nodes. Each LDPC code may comprise the following variables, for example:

1. The connections between symbol nodes and each check node;
2. The connection between check nodes and each symbol node;
3. The number of check nodes; and
4. The number of symbol nodes.

In one embodiment, the paths between the check nodes and the symbol nodes may be highly irregular due to the random nature of the LDPC code. In a fixed LDPC decoder, the paths from the check node updates to the corresponding symbol nodes and the paths from the symbol node updates to the corresponding check nodes are generally "hard wired" and do not change once the decoder is implemented. In one embodiment, reconfigurable LDPC decoder 310 provides reconfigurable routing where the paths from the check node updates to the corresponding symbol nodes and the paths from the symbol node updates to the corresponding check nodes may be change even after the decoder is implemented.

One embodiment of reconfigurable LDPC decoder 310 may comprise C check nodes and S symbol nodes, for example. Reconfigurable LDPC decoder 310 may comprise, for example, the following elements. Check nodes update module 312 comprising N BCJR blocks $BCJR_0$-$BCJR_{N-1}$. Check nodes memory 314 comprising, for example, M×N memory banks $CNM_{0,0}$ to $CNM_{N-1, M-1}$. Each check node memory bank may comprise one read port and one write port with C/N entries per bank, for example. A check node address generator module 315 comprising a check node write address generator 316 to generate the address where each check node value is to be written during a check node update and a check node read address generator module 318 to generate the address where each check node value is to be read from during a symbol node update. Symbol nodes update module 320 comprising M adder modules $A_0$ to $A_{M-1}$. A symbol node memory 322 comprising N×M memory banks $SNM_{0,0}$ to $SNM_{N-1, M-1}$. Each symbol node memory 322 bank may comprise one read port and one write port with S/M entries per bank. Symbols node address generator module 323 comprising a symbol node write address generator module 324 to generate the address where each symbol node value is to be written to during a symbol node update and a symbol node read address generator module 326 to generate the address where each symbol node value is to be read from during a check node update. Finally, module 300 may comprise a decoder controller 328 to control the operation of reconfigurable LDPC decoder 310.

During the check node update, each of the N BCJR blocks, $BCJR_0$-$BCJR_{N-1}$, computes new check node values by reading symbol node values from a corresponding horizontal slice $330_0$-$330_{N-1}$ of symbol node memory 322 and then computing the check values. The connections between each check node and its corresponding symbol nodes are stored in a memory and are addressable. In one embodiment, the connections between each check node and its corresponding symbol nodes are stored in check node address generator module 315 and are a function of each particular LDPC code. In one embodiment, the connections between each check node and its corresponding symbol nodes may be randomly generated. In one embodiment, these connections may be reprogrammed for decoding multiple LDPC codes, for example.

A BCJR block $BCJR_0$-$BCJR_{N-1}$ in check nodes update module 312 writes new check node values to the memory banks in a corresponding row $332_0$-$332_{N-1}$ of check node memory 314. These entries are copied into the M banks in the row. For example, BCJR block $BCJR_0$ writes new check node values to memory banks $CNM_{0,0}$ to $CNM_{0,M-1}$ in row $332_0$, and so on. The entries are copied to enable each adder module $A_0$ to $A_{M-1}$ to have independent access (without contention) to check node memory 314 when performing the symbol node update. In one embodiment, the number of memory banks may be decreased if each memory bank comprises multiple read ports, for example. Such embodiments, however, may consume additional power, which may be dependent upon the Silicon process used to implement check node memory 314.

During a symbol node update, each of the M adder modules 320 computes new symbol node values by reading check node values from a vertical slice $334_0$-$334_{M-1}$ of check node memory 314 and then accumulating the values. The connections between each symbol node and its corresponding check nodes are stored in the symbol address generator module 323. In one embodiment, these connections may be reprogrammed for decoding multiple codes, for example.

Adder module 320 writes new symbol node values to symbol node memory 322 in a corresponding column $336_0$-$336_{M-1}$ thereof. These entries are copied into the N banks in the column. For example, adder module $A_0$ writes new symbol node values to memory banks $SNM_{0,0}$ to $SNM_{N-1, 0}$ in column $336_0$, and so on. The entries are repeated to enable each of the N BCJR blocks $BCJR_0$-$BCJR_{N-1}$ in check nodes update module 312 to have independent access (i.e., without contention) to symbol node memory 322. In one embodiment, the number of memory banks may be decreased if each memory bank comprises multiple read ports, for example. Such embodiments, however, may consume additional power.

In one embodiment, reconfigurable LDPC decoder 310 may be implemented either in a DSP or ASIC, for example. As previously discussed, a DSP implementation may provide increased flexibility although its operating speed may require additional power consumption. In one embodiment, an ASIC may provide additional operating speed at somewhat less flexibility than a DSP implementation. Once an ASIC is hard wired, it may be difficult to reconfigure once it has been fabricated.

In one embodiment, reconfigurable LDPC decoder 310 enables a single decoder to support multiple LDPC codes. For example, in one embodiment, reconfigurable LDPC decoder 310 may be programmed for decoding multiple codes by downloading new programming instructions into address generator modules 315, 323, for example. In one embodiment, reconfigurable LDPC decoder 310 may be reprogrammed for new protocols, thus enabling it to be used in a variety of products with reduced time-to-market. In one embodiment, reconfigurable LDPC decoder 310 may eliminate problematic routing issues associated with conventional fixed LDPC decoder implementations. For example, embodiments of reconfigurable LDPC decoder 310 may provide a straightforward decoder implementation without the complex routing between check nodes and symbol nodes required in conventional decoders.

Figure 4:
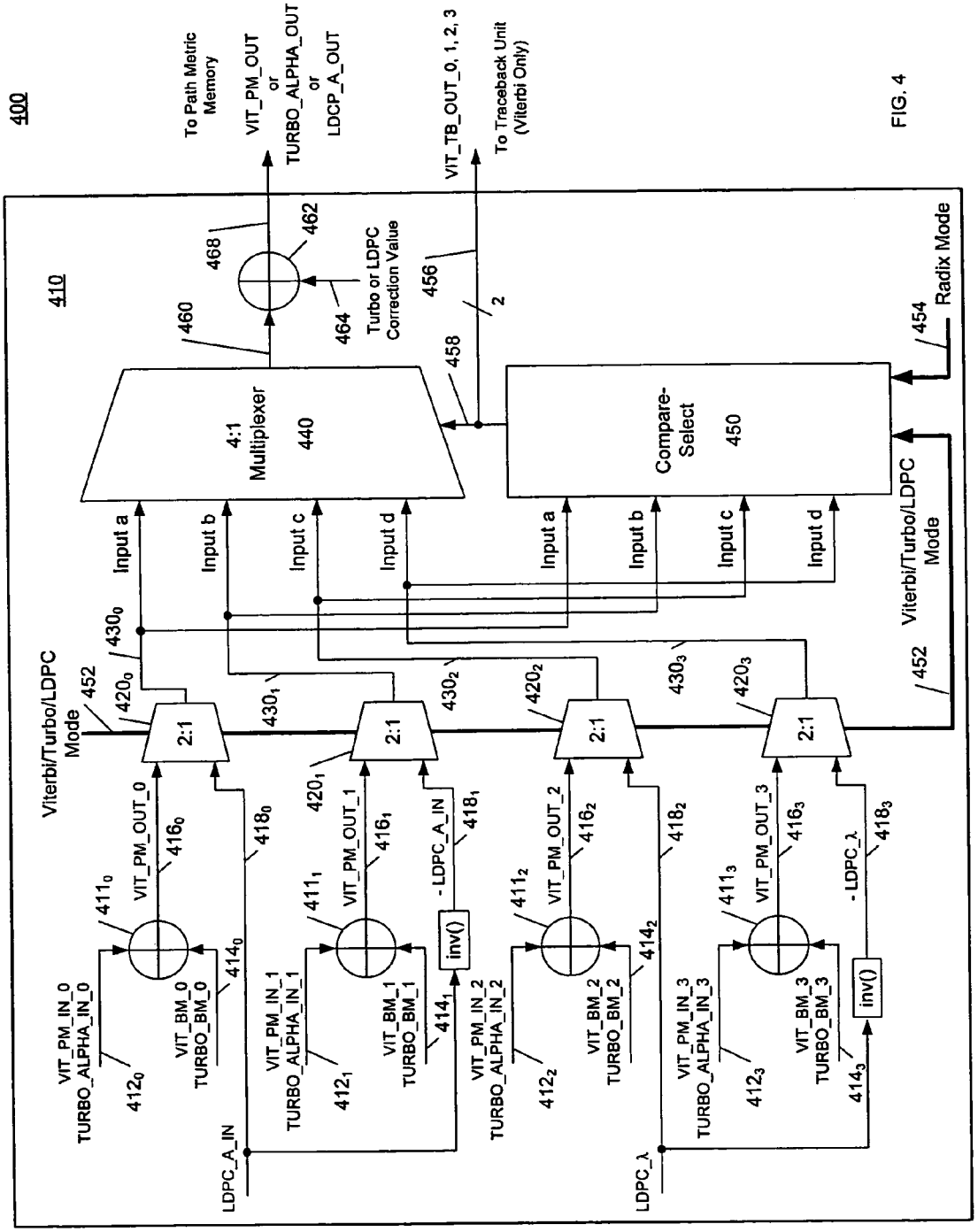
FIG. 4 illustrates one embodiment of a module 400.

FIG. 4 illustrates a block diagram of one embodiment of module 400 comprising a reconfigurable ACS module 410 to receive inputs from three types of codes, namely, Viterbi convolutional codes, turbo codes, and LDPC codes. In one embodiment, module 400 may be contained within module 300. For example, in one embodiment, module 400 may be contained within check nodes update module 312, for example. One embodiment of reconfigurable ACS module 400 comprises four input adders $411_0$, $411_1$, $411_2$, $411_3$. The output of adders $411_{0-3}$ are fed to 2:1 multiplexers $420_0$, $420_1$, $420_2$, $420_3$, respectively, and the respective outputs of 2:1 multiplexers $430_0$, $430_1$, $430_2$, $430_3$ are fed to a 4:1 multiplexer 440 at input a, input b, input c, and input d, respectively. The respective outputs $430_{0-3}$ of 2:1 multiplexers $420_{0-3}$ also are fed to a compare-select module 450 as input a, input b, input c, and input d, respectively. Compare-select module 450 receives Viterbi/Turbo/LDPC mode control input 452 and radix mode control input 454. Compare-select module 450 provides a traceback output 456 to feed a traceback module (not shown) for Viterbi codes. Compare-select module 450 also provides a control input 458 to 4:1 multiplexer 440 to select the desired Turbo or LDPC output codes. The output 460 of 4:1 multiplexer 440 is fed to adder 462 along with a correction value 464 for Turbo or LDPC codes, for example. Adder 462 then provides output 468 to path metric memory (not shown). Output 468 of adder 462 comprises, for example, the Viterbi, Turbo, or LDPC outputs.

Embodiments of reconfigurable ACS module 410 may be adapted to process various algorithms to decode Viterbi convolutional codes, BCJR algorithm turbo codes, and MPA LDPC codes, among other codes, for example. A common computational element to all three of the above listed algorithms is a variation of the Add-Compare-Select (ACS) process. For example, in a Viterbi algorithm implementation, the ACS process computes candidate path metrics by adding previous path metrics to current branch metrics and comparing and selecting the best new path metric therefrom. In a BCJR decoder implementation, the ACS process executes the log MAX algorithm to compute the forward path metrics (e.g., alphas) and backward path metrics (e.g., betas). In an LDPC decoder implementation, the ACS process computes the MAXX function in a BCJR version of the check node update in the MPA. The commonality of the ACS process element among all three of these algorithms provides one embodiment of reconfigurable ACS module 410 that may be adapted to support decoders based on these algorithms, for example.

In one embodiment, for example, reconfigurable ACS module 410 may be based on a Radix-4 (four-input) ACS process controlled via radix mode control input 454, for example. Three modes of operation of reconfigurable ACS module 410 based on the algorithms and decoders previously discussed may be controlled via Viterbi/Turbo/LDPC mode control input 452 and are described below.

First, Viterbi mode may be selected via Viterbi/Turbo/LDPC mode control input 452 to 2:1 multiplexers $420_{0, 1, 2, 3}$ and compare-select module 450. In Viterbi mode, reconfigurable ACS module 410 receives inputs VIT_PM_IN_0, VIT_PM_IN_1, VIT_PM_IN_2, VIT_PM_IN_3 at first inputs $412_{0, 1, 2, 3}$ of adders $411_{0, 1, 2, 3}$, respectively, and receives inputs VIT_BM_IN_0, VIT_BM_IN_1, VIT_BM_IN_2, VIT_BM_IN_3 at second inputs $414_{0, 1, 2, 3}$ of adders $411_{0, 1, 2, 3}$, respectively, and computes expression (1) below. The results of the computations are four outputs VIT_PM_OUT_0, VIT_PM_OUT_1, VIT_PM_OUT_2, and VIT_PM_OUT_3 at outputs $416_{0, 1, 2, 3}$ of adders $411_{0, 1, 2, 3}$, respectively, which form one of the inputs to 2:1 multiplexers $420_{0, 1, 2, 3}$. Further, in one embodiment, when operating in Viterbi mode, reconfigurable ACS module 410 also outputs four traceback bits VIT_TB_OUT_0, VIT_TB_OUT_1, VIT_TB_OUT_2, VIT_TB_OUT_3 at output 456 of compare-select module 450.

$$\text{VIT\_PM\_OUT} = \min \begin{bmatrix} \text{VIT\_PM\_IN\_0} + \text{VIT\_BM\_0} \\ \text{VIT\_PM\_IN\_1} + \text{VIT\_BM\_1} \\ \text{VIT\_PM\_IN\_2} + \text{VIT\_BM\_2} \\ \text{VIT\_PM\_IN\_3} + \text{VIT\_BM\_3} \end{bmatrix} \quad (1)$$

Second, Turbo mode may be selected via Viterbi/Turbo/LDPC mode control input 452 to 2:1 multiplexers $420_{0, 1, 2, 3}$ and compare-select module 450. In turbo mode, reconfigurable ACS module 410 computes the alphas and betas of the BCJR algorithm. When computing the alphas, inputs to reconfigurable ACS module 410 TURBO_ALPHA_IN_0, TURBO_ALPHA_IN_1, TURBO_ALPHA_IN_2, TURBO_ALPHA_IN_3 may be applied to inputs $412_{0, 1, 2, 3}$ of adders $411_{0, 1, 2, 3}$, respectively, and inputs TURBO_BM_0, TURBO_BM_1, TURBO_BM_2, TURBO_BM_3 may be applied to inputs $414_{0, 1, 2, 3}$ of adders $411_{0, 1, 2, 3}$ to compute expression (2) below. The results of the computations are four outputs TURBO_ALPHA_OUT_0, TURBO_ALPHA_OUT_1, TURBO_ALPHA_OUT_2, and TURBO_ALPHA_OUT_3 at outputs $416_{0, 1, 2, 3}$ of adders $411_{0, 1, 2, 3}$, respectively, which form one of the inputs to 2:1 multiplexers $420_{0, 1, 2, 3}$. Further, in one embodiment, when operating in Turbo mode, reconfigurable ACS module 410 also may provide a correction factor at input 464 of adder 462 to improve decoder performance, for example. A similar expression may be written for computing the betas.

$$\text{TURBO\_ALPHA\_OUT} = \min \begin{bmatrix} \text{TURBO\_ALPHA\_IN\_0} + \text{TURBO\_BM\_0} \\ \text{TURBO\_ALPHA\_IN\_1} + \text{TURBO\_BM\_1} \\ \text{TURBO\_ALPHA\_IN\_2} + \text{TURBO\_BM\_2} \\ \text{TURBO\_ALPHA\_IN\_3} + \text{TURBO\_BM\_3} \end{bmatrix} \quad (2)$$

Third, LDPC mode may be selected via Viterbi/Turbo/LDPC mode control input 452 to 2:1 multiplexer $420_{0, 1, 2, 3}$ and compare-select module 450. In LDPC mode, reconfigurable ACS module 410 computes check node updates using the BCJR algorithm and receives inputs LPDC_A_IN at input $418_0$ of multiplexer $420_0$ and –LPDC_A_IN at input $418_1$ of multiplexer $420_1$. Reconfigurable ACS module 410 also receives inputs LDPC_$\lambda$_IN at input $418_2$ of multiplexer $420_2$ and –LDPC_$\lambda$_IN at input $418_3$ of multiplexer $420_3$ and computes expression (3) below. Further, in one embodiment, when operating in LDPC mode, reconfigurable ACS module 410 also may provide a correction factor at input 464 of adder 462 to improve decoder performance, for example. A similar expression may be written to compute LDPC_B_OUT (this is analogous to the betas in the turbo BCJR algorithm) and the final check node value A.

$$\text{LDPC\_A\_OUT} = \quad (3)$$
$$\left\{ \begin{array}{l} sgn(\text{LDPC\_A\_IN})\text{LDPC\_}\lambda \text{ if } |\text{LDPC\_A\_IN}| > |\text{LDPC\_}\lambda| \\ sgn(\text{LDPC\_}\lambda)\text{LDPC\_A\_IN otherwise} \end{array} \right\}$$

Unlike decoder techniques based on reconfigurable ACS module 410, conventional decoder techniques may require a separate decoder for each type of code described above. Embodiments described herein provide a reconfigurable ACS module 410 that may be configured for decoding Viterbi convolutional codes, turbo codes, and LDPC codes. Thus, reconfigurable ACS module 410 may require less area and power than three separate decoders, for example. A receiver 250a, b (FIG. 2) comprising reconfigurable ACS module 410 may be programmed for new protocols, enabling it to be used in multiple applications with reduced time-to-market, for example.

Figure 5A:
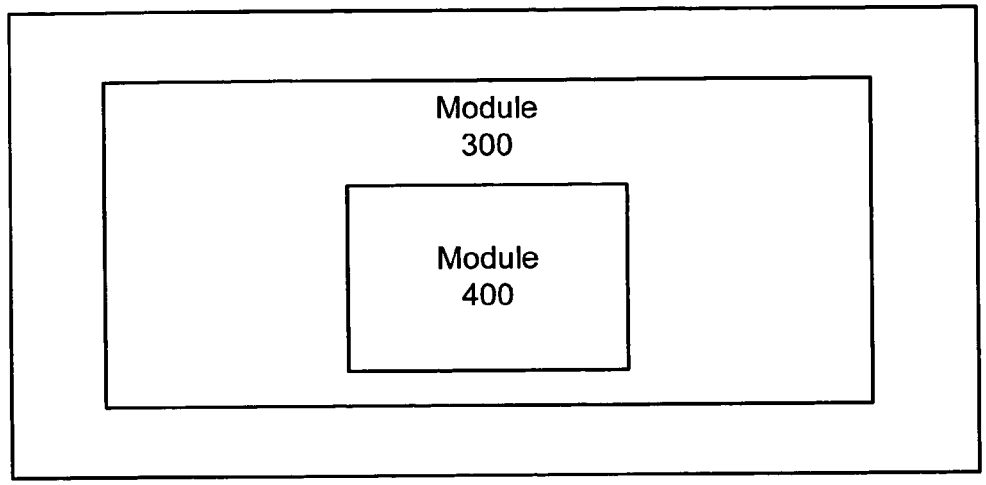
FIG. 5A illustrates one embodiment of a module 500.

FIG. 5A illustrates one embodiment of a module 500. In one embodiment, module 500 may comprise module 300 and module 400 operably coupled thereto. In one embodiment, module 400 may be contained within module 300. For example, in one embodiment, module 400 may be contained within check nodes update module 312. In one embodiment, module 300 may comprise reconfigurable LDPC decoder 310 and module 400 may comprise reconfigurable ACS module 410 to support multiple types of decoders used in various embodiments of transceivers, for example. For example, as previously discussed, one embodiment of reconfigurable ACS module 410 may support a variety of decoders based on Viterbi, BCJR, and LDPC algorithms. In one embodiment, reconfigurable ACS module 410 may support reconfigurable LDPC decoder 310, for example. Embodiments of module 500 may comprise reconfigurable ACS module 410 configured to decode Viterbi convolutional codes, turbo codes, and LDPC codes, for example. Further, reconfigurable ACS module 410 may decode these three types of codes in less area and consume less power than conventional implementations comprising three separate decoders. Moreover, embodiments of transceiver array 230 (FIG. 2) that incorporate reconfigurable ACS module 410 may be reprogrammed for new protocols and thus enable it to be more widely used across telecommunications products with reduced time-to-market. Thus module 500, implemented in transceiver array 230 (FIG. 2) comprising reconfigurable LPDC decoder 310 and reconfigurable ACS module 410 may operate by receiving multiple codes, including, for example, codes from reconfigurable LDPC decoder 310.

Figure 5B:
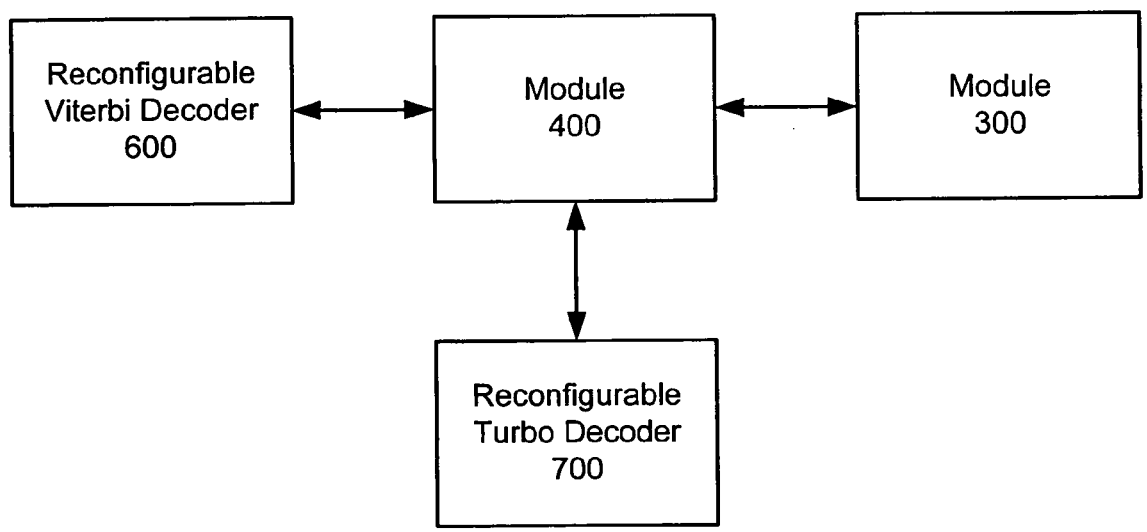
FIG. 5B illustrates one embodiment of a module 510.

FIG. 5B illustrates one embodiment of a module 510. In one embodiment, module 510 may comprise module 300 comprising reconfigurable LDPC decoder 310, module 520 comprising a reconfigurable Viterbi decoder 600, and module 530 comprising a reconfigurable Turbo decoder 700, each one operably coupled to module 400. As indicated previously, in one embodiment module 400 may comprise a reconfigurable ACS module 410. In one embodiment, module 400 may be contained within any one of modules 300, 520, and 530, for example. For example, in one embodiment, module 400 may be a component of any one of modules 300, 520, and 530. For example, module 400 may comprise reconfigurable ACS module 410 to support multiple types of decoders used in various embodiments of transceivers, such as, for example, reconfigurable Viterbi decoder 520, reconfigurable Turbo decoder 530, and reconfigurable LDPC decoder 310.

Operations for the above embodiments may be further described with reference to the following figures and accompanying examples. Some of the figures may include a logic flow. Although such figures presented herein may include a particular logic flow, it can be appreciated that the logic flow merely provides an example of how the general functionality described herein can be implemented. Further, the given logic flow does not necessarily have to be executed in the order presented unless otherwise indicated. In addition, the given logic flow may be implemented by a hardware element, a software element executed by a processor, or any combination thereof. The embodiments are not limited in this context.

Figure 6:
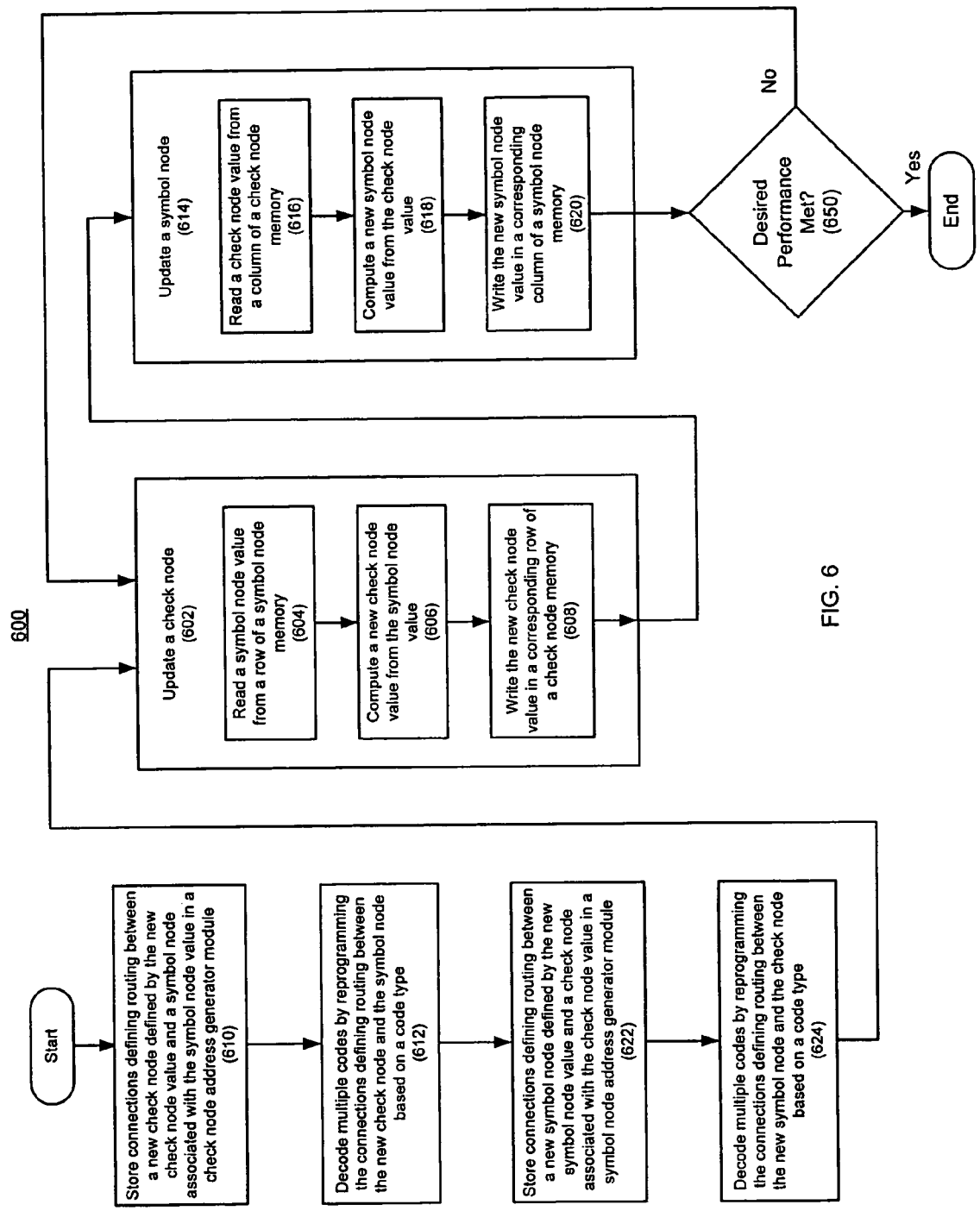
FIG. 6 illustrates one embodiment of a logic flow 600.

FIG. 6 illustrates one embodiment of a logic flow. FIG. 6 may illustrate a block flow diagram of a logic flow 600. Logic flow 600 may be representative of the operations executed by one or more systems described herein, such as component 200 as implemented as part of nodes 110, 120 or 130, for example. Logic flow 600 may be representative of the operations to reconfigure reconfigurable LDPC decoder 310 to decode a variety of codes in a single receiver (FIG. 3), for example. Logic flow 600 may form a portion of an article comprising a machine-readable storage medium containing instructions that if executed enable a system to perform all or portions of the logic flow 600. As shown, logic flow 600 first configures reconfigurable LDPC decoder 310 by executing blocks 610-624. Logic flow 600 then iterates between updating a check node 602 and updating a symbol node 614 until a desired performance (e.g., bit error rate) is achieved or a maximum number of iterations are reached. Accordingly, logic flow 600 stores connections defining routing between a new check node defined by the new check node value and a symbol node associated with the symbol node value in a check node address generator module (610). Logic flow 600 decodes multiple codes by reprogramming the connections defining routing between the new check node and the symbol node based on a code type (612). Logic flow 600 decodes multiple codes by reprogramming the connections defining routing between the new symbol node and the check node based on a code type (622). Logic flow 600 then decodes multiple codes by reprogramming the connections defining routing between the new symbol node and the check node based on a code type (624). The embodiments are not limited in this context.

Turning now to one of the iterative operations, logic flow 600 updates a check node (602). Accordingly, logic flow 600 reads a symbol node value from a row of a symbol node memory (604), computes a new check node value from the symbol node value (606), and writes the new check node value in a corresponding row of a check node memory (608). The embodiments are not limited in this context.

Logic flow 600 then updates a symbol node (614). Accordingly, logic flow 600 reads a check node value from a column of a check node memory (616), computes a new symbol node value from the check node value, and writes the new symbol node value in a corresponding column of a symbol node memory (618). Logic flow 600 stores connections defining routing between a new symbol node defined by the new symbol node value and a check node associated with the check node value in a symbol node address generator module (620). Logic flow 600 then determines whether a desired level of performance has been achieved or whether a maximum number of iterations have been reached. The embodiments are not limited in this context.

It should be understood that the embodiments may be used in a variety of applications. As described above, the circuits and techniques disclosed herein may be used in many apparatuses such as transmitters and receivers of a radio system. Transmitters and/or receivers intended to be included within the scope of the embodiments may include, by way of example only, WLAN transmitters and/or receivers, MIMO transmitters-receivers system, two-way radio transmitters and/or receivers, digital system transmitters and/or receivers, analog system transmitters and/or receivers, cellular radiotelephone transmitters and/or receivers, and so forth. The embodiments are not limited in this context.

Types of WLAN transmitters and/or receivers intended to be within the scope of the embodiments may include, although are not limited to, transmitters and/or receivers for transmitting and/or receiving spread spectrum signals such as, for example, FHSS or DSSS OFDM transmitters and/or receivers, and so forth. The embodiments are not limited in this context.

Numerous specific details have been set forth herein to provide a thorough understanding of the embodiments. It will be understood by those skilled in the art, however, that the embodiments may be practiced without these specific details. In other instances, well-known operations, components and circuits have not been described in detail so as not to obscure the embodiments. It can be appreciated that the specific structural and functional details disclosed herein may be representative and do not necessarily limit the scope of the embodiments.

It is also worthy to note that any reference to "one embodiment" or "an embodiment" means that a particular feature, structure, or characteristic described in connection with the embodiment is included in at least one embodiment. The appearances of the phrase "in one embodiment" in various places in the specification are not necessarily all referring to the same embodiment.

Some embodiments may be implemented using an architecture that may vary in accordance with any number of factors, such as desired computational rate, power levels, heat tolerances, processing cycle budget, input data rates, output data rates, memory resources, data bus speeds and other performance constraints. For example, an embodiment may be implemented using software executed by a general-purpose or special-purpose processor. In another example, an embodiment may be implemented as dedicated hardware, such as a circuit, an application specific integrated circuit (ASIC), Programmable Logic Device (PLD) or digital signal processor (DSP), and so forth. In yet another example, an embodiment may be implemented by any combination of programmed general-purpose computer components and custom hardware components. The embodiments are not limited in this context.

Some embodiments may be described using the expression "coupled" and "connected" along with their derivatives. It should be understood that these terms are not intended as synonyms for each other. For example, some embodiments may be described using the term "connected" to indicate that two or more elements are in direct physical or electrical contact with each other. In another example, some embodiments may be described using the term "coupled" to indicate that two or more elements are in direct physical or electrical contact. The term "coupled," however, also may mean that two or more elements are not in direct contact with each other, but yet still co-operate or interact with each other. The embodiments are not limited in this context.

Some embodiments may be implemented, for example, using a machine-readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory module, such as the examples given with reference to FIG. 2. For example, the memory module may include any memory device, memory article, memory medium, storage device, storage article, storage medium and/or storage module, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, various types of Digital Versatile Disk (DVD), a tape, a cassette, or the like. The instructions may include any suitable type of code, such as source code, compiled code, interpreted code, executable code, static code, dynamic code, and the like. The instructions may be implemented using any suitable high-level, low-level, object-oriented, visual, compiled and/or interpreted programming language, such as C, C++, Java, BASIC, Perl, Matlab, Pascal, Visual BASIC, assembly language, machine code, and so forth. The embodiments are not limited in this context.

While certain features of the embodiments have been illustrated as described herein, many modifications, substitutions, changes and equivalents will now occur to those skilled in the art. It is therefore to be understood that the appended claims are intended to cover all such modifications and changes as fall within the true spirit of the embodiments.

The invention claimed is:

1. A system, comprising:
a configurable low density parity check (LDPC) decoder configured to read a symbol node value from a symbol node memory, to compute a new check node value from the symbol node value, to write the new check node value in a check node memory, to read a check node value from the check node memory, to compute a new symbol node value from the check node value, to write the new symbol node value in the symbol node memory, to generate a new check node address associated with the new check node value and a symbol node address associated with the symbol node value, and to change connections between the new check node address and the symbol node address based on a code type; and
multiple inputs configured to receive a plurality of code types wherein at least one input of the multiple inputs is configured to receive a LDPC code.

2. The system of claim 1, wherein the connections are routed using multiplexers.

3. The system of claim 1, wherein the configurable LDPC decoder supports a plurality of LDPC codes.

4. The system of claim 1, wherein the configurable LDPC decoder is used to implement a message passing algorithm (MPA) to iterate between updating the check node memory and the symbol node memory.

5. A method of error correction using a configurable low-density parity-check (LDPC) decoder, comprising:
reading a symbol node value from a symbol node memory;
computing a new check node value from the symbol node value;
writing the new check node value in a check node memory of the configurable LDPC decoder;
reading a check node value from the check node memory;
computing a new symbol node value from the check node value;
writing the new symbol node value in the symbol node memory of the configurable LDPC decoder;
generating a new check node address associated with the new check node value and a symbol node address associated with the symbol node value; and
changing connections between the new check node address and the symbol node address based on a code type, wherein multiple inputs are configured to receive a plurality of code types and wherein at least one input of the multiple inputs is configured to receive a LDPC code.

6. The method of claim 5, wherein the connections are routed using multiplexers.

7. The method of claim 5, wherein the configurable LDPC decoder supports a plurality of LDPC codes.

8. The method of claim 5, wherein the configurable LDPC decoder is used to implement a message passing algorithm (MPA) to iterate between updating the check node memory and the symbol node memory.

* * * * *